United States Patent [19]
Matrone

[11] Patent Number: 4,616,971
[45] Date of Patent: Oct. 14, 1986

[54] ROBOTIC HAND AND METHOD FOR MANIPULATING PRINTED CIRCUIT BOARDS

[75] Inventor: John L. Matrone, Schenectady, N.Y.

[73] Assignee: Fairchild Camera and Instrument Corp.

[21] Appl. No.: 540,415

[22] Filed: Oct. 11, 1983

[51] Int. Cl.⁴ ............................................. B25J 15/10
[52] U.S. Cl. ...................................... 414/730; 29/832; 294/86.4; 294/88; 414/740; 414/741; 414/786; 901/39
[58] Field of Search ............... 414/739, 741, 749, 786, 414/730, 740; 294/86 R, 88, 103 R, 86.4, 103.1; 29/759, 760, 832, 834; 901/30, 31, 39

[56] References Cited

U.S. PATENT DOCUMENTS

| | | | |
|---|---|---|---|
| 2,925,300 | 2/1960 | Kelley | 294/86 R X |
| 3,640,519 | 2/1972 | Halstead | 209/254 |
| 3,866,966 | 2/1975 | Skinner, II | 294/106 |
| 3,884,363 | 5/1975 | Ajlouny | 294/103 R X |
| 3,901,547 | 8/1975 | Skinner, II | 294/88 |
| 4,252,360 | 2/1981 | Gallaher, Jr. | 294/86 |
| 4,273,506 | 6/1981 | Thomson et al. | 294/88 X |
| 4,375,936 | 3/1983 | Dechantsreiter | 294/103.2 |
| 4,479,673 | 10/1984 | Inaba et al. | 294/86 R X |
| 4,501,523 | 2/1985 | Haider | 414/753 X |

FOREIGN PATENT DOCUMENTS 1114713 10/1961 Fed. Rep. of Germany ...... 414/740

Primary Examiner—Robert J. Spar
Assistant Examiner—Donald W. Underwood
Attorney, Agent, or Firm—Heslin & Rothenberg

[57] ABSTRACT

Three sets of pincer units depend from a flat palm, each pincer unit having a pinching gap at its distal end for engaging a loaded circuit board by its edges and holding it in a spaced-apart relationship with the palm. Each pincer unit includes a finger having a flange at its distal end and a thumb slideably mounted on the finger so as to define a variable pinching gap. The fingers are mounted for prehensiling movement away from one another for bracketing a board to be picked up and toward one another so that the board to be picked up may be squeezed between them.

The invention includes a method for picking up a loaded circuit board which involves bracketing a board to be picked up between a set of pincer units, squeezing the board by moving the pincer units toward one another against opposing edges of the board while simultaneously pinching each edge engaged with the pincer units.

19 Claims, 13 Drawing Figures

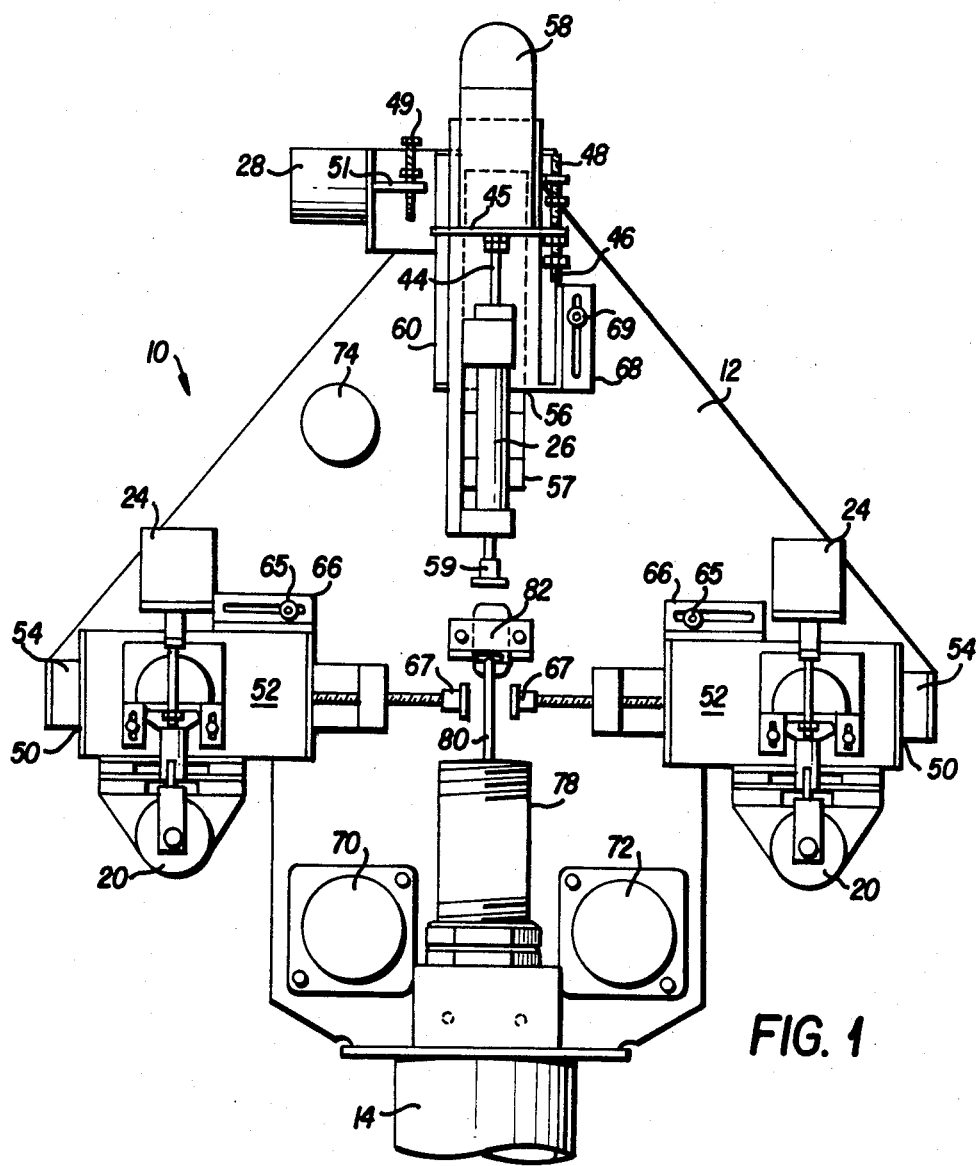
FIG. 1
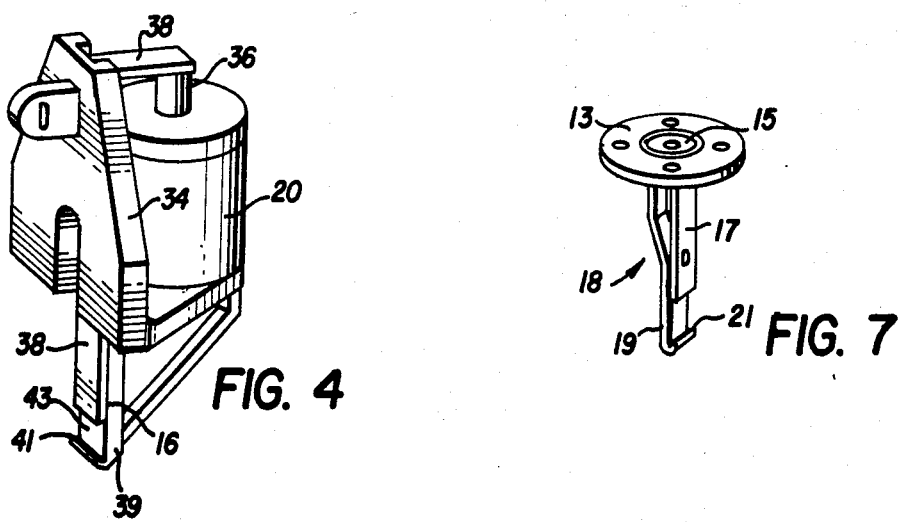
FIG. 4
FIG. 7

ROBOTIC HAND AND METHOD FOR MANIPULATING PRINTED CIRCUIT BOARDS

FIELD OF THE INVENTION

This invention relates to band type grippers used with robots in automated systems. More specifically, this invention is a gripper for holding and transporting loaded circuit boards.

BACKGROUND AND SUMMARY OF THE INVENTION

Printed circuit boards are tested prior to distribution in order to determine whether they have any electrical defects. This is generally accomplished by connecting a circuit board to be tested to a test system by means of a test fixture having a plurality of probes for contacting certain points on the back of the board.

The circuit boards are generally delivered to a test area in a container which is commonly referred to as a "tote box." The tote box has a series of slots, each of which contains one circuit board. The dimensions of each slot are sufficiently large to accommodate a variety of board sizes and to facilitate loading of the tote box. Similarly, the space between each slot is sufficient to accommodate the components which extend above the surface of the board. Thus, the circuit boards are relatively loosely fitted within the tote A test station is usually operated by a person standing within reach of the tote box and the test fixture of a test system. The operator repetitively reaches into the tote box for a circuit board to be tested, places it on the test fixture and waits for the test to be completed. Upon completion of the test, the board is removed from the test fixture and placed with known good boards or routed to a repair area.

Various attempts have been made to replace the human operator with a robot. However, a number of problems have been encountered in creating systems which can pick up the circuit boards from tote boxes, transport them without dropping them, accurately place them on a test fixture and finally, pick them up again from the test fixture after completion of the test, all without inflicting any damage to the board or the components found thereon. To begin with, picking up a circuit board from a tote box is quite different than picking one up from a gasketed test fixture. This is due to the fact that the location of circuit boards within the slots of tote boxes is not as accurate as their location when properly placed upon a gasketed test fixture. The variation in location within a tote box is on the order of plus or minus 30 mils. For circuit boards properly located upon test fixtures, this variation runs only about 4 mils. Accordingly, a suitable robotic hand must meet different sets of requirements in order to be able to pick up and deposit a circuit board in these two different situations. A complicating factor concerns the gasket configuration typically found on test fixtures. It is normally provided with a recess into which the board is placed, thereby at least partially blocking access to the edges of the board. Still another problem, at least with some boards, is that they are somewhat flexible. As a result, they can be easily dropped during transportation by a robot when they flex under the inertial forces experienced with today's high speed robot systems. A final problem is that most circuit boards offer very little edge space that is free of components or electrical leads. Thus, it becomes quite difficult to grip a board by its edges without causing damage.

Prior devices have sought to overcome these problems in a number of ways. One device utilizes a large number of vacuum cups which grasp and hold the loaded circuit boards by means of suction. The vacuum cups are arranged on the hand so as to correspond with components having a flat surface in order to obtain a secure grip on the board. Due to the lack of large flat surface areas on most printed circuit boards, and also due to the movement of the robot itself, which tends to dislodge the boards, a large number of vacuum cups are generally required. Also, since the vacuum cups must be in a pattern corresponding to that of the components having flat surfaces, a different hand member has to be used for each different type of circuit board to be tested. The need to match hand members to the circuit boards being tested is not only time consuming, but also expensive, and therefore, preferably avoided. While the vacuum cups themselves do not generally damage the components, the cups can attach to the circuit board at improper locations due to the varying positions of the circuit boards in the tote boxes. This results in less than adequate suction and it is likely that the board will be dropped during transportation to or from the test fixture. Aside from the damage which can be caused to the board if it is dropped, most systems will automatically stop when any such irregularity occurs, thus requiring human intervention to cure the difficulty and restart the procedure.

Another approach which has been used for transporting loaded circuit boards utilizes a pair of grooved parallel bars. The circuit board is positioned between the bars after which the bars are moved together, thereby wedging the circuit board between the bars and within the grooves. One drawback of this approach is that the circuit board must have two parallel edges and the edges must be free from components so as not to be damaged when the bars grasp the board. Other difficulties are encountered when the circuit boards being tested are flexible and cannot be secured simply by wedging them between the bars or when the circuit boards, which can vary in width by about 30 mils, are of a width that does not correspond to the spacing of the bars. Finally, it has been found that this approach tends to damage the test fixture gasket or loosen the connection between the gasket and the test fixture. Alternatively this approach would require the incorporation of complex and expensive structures within the fixture to lift the board from the fixture in order to allow it to be grasped by the parallel bars.

These and other problems are solved by the current invention. The robotic hand of this invention is capable of reaching into the relatively narrow confines of a tote box slot and gripping a loaded circuit board previously placed therein with a degree of accuracy typical of current practice. Also, the robotic hand of this invention can grip a circuit board at selected spots along its edges without causing any damage to the board or any of the components found thereon. The resulting grip is firm enough and secure enough to withstand the inertial forces encountered in a high speed robotic system. Finally, the device to be described herein is suitable for picking up a circuit board from a recessed position within a test fixture gasket without damaging the gasket in any way or loosening its connection with the test fixture or requiring extra expensive lift devices on the various test fixtures to be utilized. These and other attributes of the invention will become apparent in the detailed description which follows.

It is, therefore, an object of this invention to provide a robotic hand suitable for picking up and transporting a loaded circuit board by making minimal contact with its edges.

It is a further object of this invention to provide a robotic hand of the type described which is suitable for reaching into a typical tote box and picking up a loaded circuit board previously placed therein and ultimately replacing that board in either the same or another tote box with a degree of accuracy in accordance with present practices.

It is a further object of this invention to provide a robotic hand of the type described suitable for accurately placing a circuit board on a test fixture, releasing the circuit board and withdrawing the hand without causing damage to the gasket typically found on test fixtures.

It is a further object of this invention to provide a robotic hand of the type described suitable for picking up a circuit board from a test fixture without requiring modification of test fixture or causing damage to the test fixture gasket.

It is a further object of this invention to provide a robotic hand of the type described capable of gripping a flexible circuit board with sufficient strength so as not to drop the board when it flexes under the inertial forces experienced in a high speed robotic system.

Briefly described, the above objects are accomplished with a hand member having at least two and preferably three opposing pincer units.

In the preferred embodiment, two of the pincer units are designed to engage the same edge of the circuit board and lie along a predetermined reference line. These two pincer units are laterally adjustable relative to each other so as to engage clear spots on the edge of the board. A pincer unit adjacent the opposite edge of the board is longitudinally adjustable to accommodate boards of various sizes. Each pincer unit has a thumb and finger set operated between a pinching state where the gap between them is relatively closed and a releasing state wherein the gap is relatively opened. In addition, since these pincer units depend from the hand, the circuit board can be held in a spaced-apart relationship with respect to the palm which allows room for the various circuit board components. The opposing pincers are also mounted so as to allow the distances between the pincers to be varied. This permits the pincers to squeeze the circuit board between themselves while pinching its edges. This dual securing aspect of the invention allows for a sufficiently firm grip of the circuit board without damaging any of the components. In addition, since the fingers extend outwardly from the hand, they can be used to depress the gaskets along a selected short section of the boards perimeter and can then be extended beneath the circuit board for removing it from the test fixture without damaging the gasket.

The method of this invention involves the steps of bracketing a pair of opposing edges of a circuit board with pincer units having variable pinching gaps, squeezing the board between the pincer units by moving the pincer units toward one another and finally, pinching the edges of the circuit board.

BRIEF DESCRIPTION OF THE DRAWINGS

FIG. 1 is a top plan view of the robot hand of this invention with its cover removed.

FIG. 4 is a perspective view of a rear pincer unit and its associated mounting bracket and pinch cylinder.

FIG. 7 is a perspective view of the front pincer unit.

DETAILED DESCRIPTION OF THE DRAWINGS

Figure 2:
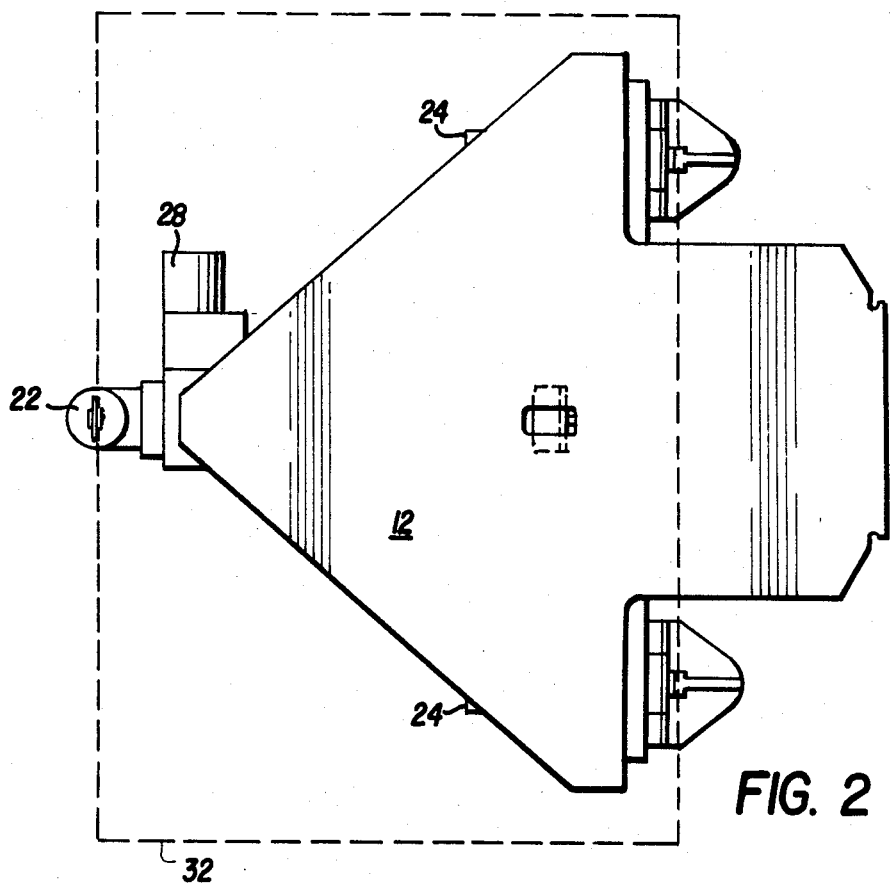
FIG. 2 is a bottom plan view of the hand showing a circuit board in phantom held by the hand.
Figure 3:
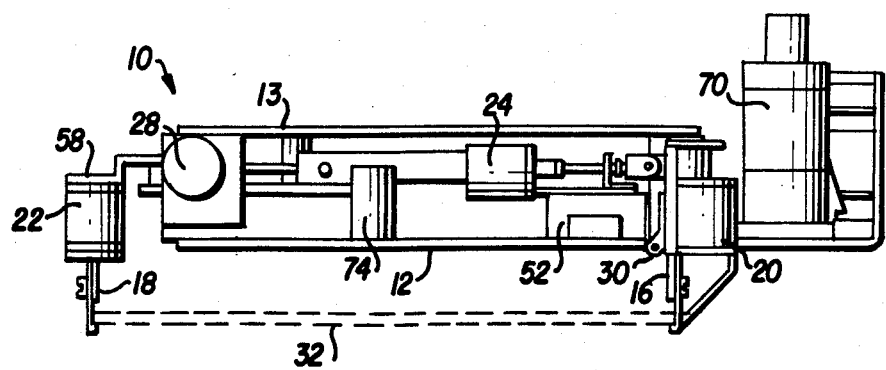
FIG. 3 is a left side elevation of the hand showing a circuit board in phantom held by the hand.

FIGS. 1, 2 and 3 show the general organization of the robot hand of this invention. As best seen in FIGS. 1 and 3, hand 10 is provided with one front pincer unit 18 distal from and generally on the axis of a wrist connector 14 and two rear pincer units 16 on either side of wrist connector 14 mounted in an opposed relationship with front pincer unit 18. A palm plate 12 serves as a base upon which the pincer units are mounted. A pincer unit may be considered for the purpose of this description as including a thumb and finger set in which the thumb is slideably mounted on the finger so as to define a variable pinching gap. As may be generally seen in FIGS. 2 and 3, a circuit board 32 may be held by its opposing edges between the pinching gaps of front pincer unit 18 and rear pincer units 16. "Opposing edges" for the purpose of this description is intended to refer to edges of a circuit board which are generally on opposite sides thereof. A more detailed explanation of the structure and operation of the pincer units will be presented in connection with the discussion of the other figures which follows. The various cylinders to be referred to in this description are all pneumatic air cylinders, but the pneumatic lines and fittings have been omitted for the sake of simplicity. The operation of the cylinders is controlled through solenoids 70, 72 and 74 which are conveniently mounted on palm 12. The pneumatic lines running between these solenoids and the cylinders as well as the electrical connections between the solenoids and the robot control circuits are shown schematically in FIG. 9 to be described below.

It should be noted that other comparable drive devices such as electrical drive devices are equally acceptable.

Still referring to FIGS. 1, 2 and 3, it may be seen that each rear pincer unit 16 has an associated pinching cylinder 20 and a squeeze cylinder 24. These structures are mounted on a sliding block 52 which, in turn, is slideably mounted on a track 54. Track 54 is rigidly mounted on palm 12. Sliding block 52 and track 54 comprise a slide assembly 50 which may be of any conventional type. The purpose of this slide assembly arrangement is to permit the two rear pincer units to be moved toward and away from one another so that the pincer units may be strategically placed for engagement with a clear portion of the edge of a circuit board 12.

The positions of sliding blocks 52 are controlled by adjusting screws 67.

Such screws may be of the mechanical thumb type as shown. Alternatively the sliding blocks 52 may be adjusted with drive motors driving individual positioning lead screws. Typically sensors would also be provided to indicate the positioning of such screws. Once the blocks have been moved to desired positions, they may be fixed there by means of adjustment brackets 66 and hold down bolts 65.

As may be seen in FIG. 3, the connection between rear pincer units 16 and their associated sliding blocks 52 is by means of hinges 30. It will be more fully appreciated as this description proceeds that the purpose of the hinges 30 is to permit the rear pincer units 16 to be pivoted in prehensiling movements toward and away from front pincer unit 18. Thus, each rear pincer unit is capable of two types of movement, a lateral movement transverse to the axis of wrist connector 14 for selection of a clear spot on the circuit board to be picked up and a prehensiling movement for use in actually picking up or releasing a circuit board.

Front pincer unit 18 is mounted on front pinching cylinder 22 which, in turn, is mounted on a driving bracket 58 as shown in FIGS. 1, 2 and 3. A squeeze cylinder 26 is connected to driving bracket 58 by means of piston rod 44. A limit bar 45 is mounted transversely to piston rod 44 at its connection with driving bracket 58. All of these structures are mounted on a sliding block 60 by means of front mounting bracket 62, all as more clearly shown in FIG. 6. Still referring to FIG. 1, it will be seen that sliding block 60 is mounted on a track 57 which is rigidly mounted on palm 12 on the axis of wrist connector 14. Track 57 and mounting block 60 comprise a slide assembly 56 similar to rear slide assemblies 50. The position of front sliding block 60 may be adjusted by operation of the adjusting screw 59 and anchored in a selected position by means of front adjustment bracket 68 and hold down bolt 69, or by motor driven lead screws as previously described. By means of the structures just described, and others to be described in more detail below, front pincer unit 18 is driven by cylinder 26 in prehensiling movements toward and away from the rear pincer units 16 within a limited range of movement for a given position of sliding block 60. The range of the prehensiling movement of front pincer unit 18 can thus be translated toward and away from wrist connector 14 by repositioning sliding block 60. This permits hand 10 to accommodate circuit boards of various sizes.

Figure 5A:
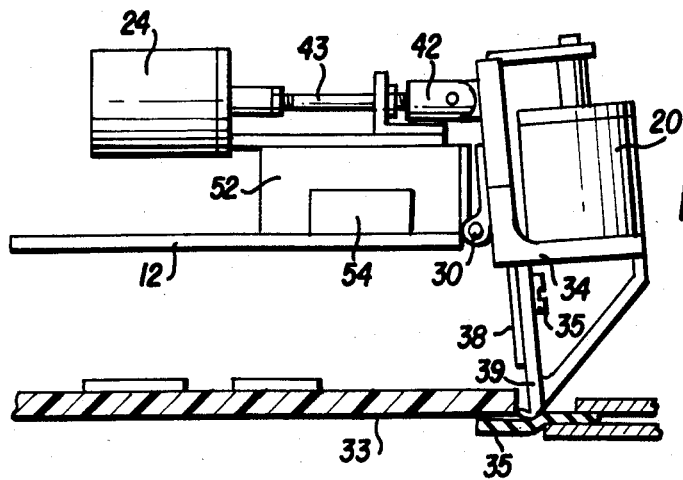
FIGS. 5(a), 5(b) and 5(c) show a sequence of operations of a rear pincer unit and some of its associated structures.
Figure 5B:
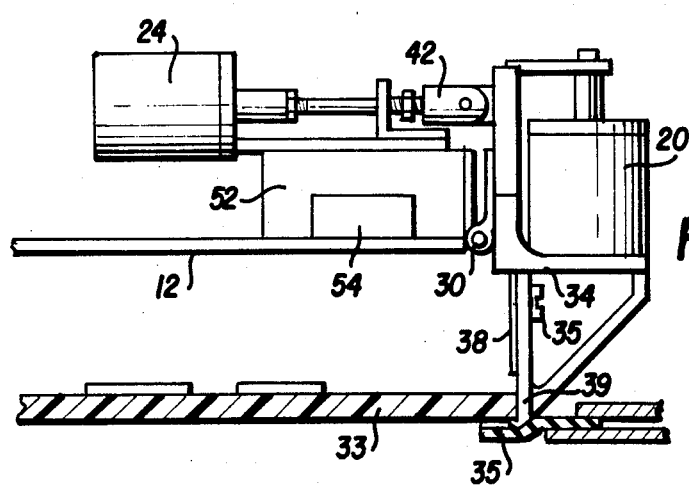
Figure 5C:
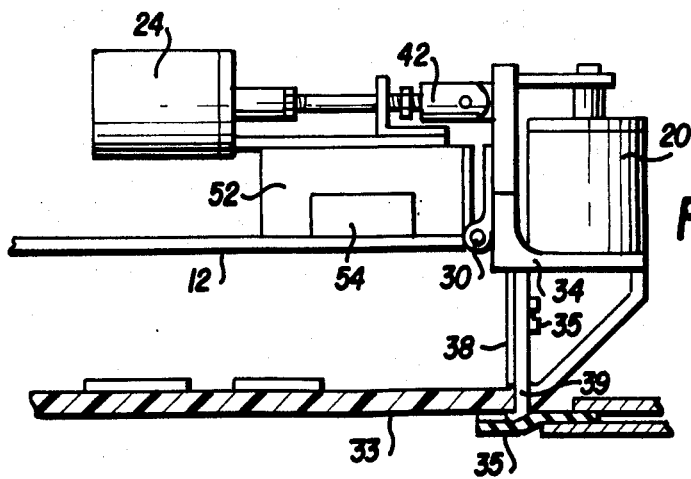

FIG. 4, together with FIGS. 5(a), 5(b) and 5(c), show rear pincer units 16 and their associated structures in greater detail. Each pincer unit 16 includes a finger 39 and an L-shaped thumb 38. Finger 39 is rigidly connected to a bracket 34 and thumb 38 is slideably mounted on finger 39. The distal end of finger 39 is provided with a flange 41. The space between flange 41 and the distal end of thumb 38 forms a pinching gap 43 into which the edge of a circuit board may be inserted. As thumb 38 slides along finger 39, the size of pinching gap 43 varies. Thumb 38 is connected to pinch cylinder 20 by means of a piston rod 36. Thus, as the piston within cylinder 20 is driven back and forth, thumb 38 is resiliently driven so as to slide along finger 39. In this manner, the size of pinching gap 43 is controlled. It may be noted that flange 41 and the distal end of thumb 38 are beveled so as to draw the pincer unit 16 toward a board being pinched between them.

Referring to FIGS. 5(a), (b) and (c), it will be seen, as noted above, that mounting bracket 34 is connected to sliding block 52 by means of hinge 30. Squeeze cylinder 24 is operatively connected to bracket 34 by means of linkage 42 and piston rod 43. Thus, as the piston within squeeze cylinder 24 is driven back and forth, bracket 34 and rear pincer unit 16 is tilted with respect to palm 12 in prehensiling movements in which pincer unit 16 is resiliently driven toward or away from front pincer unit 18.

Figure 6:
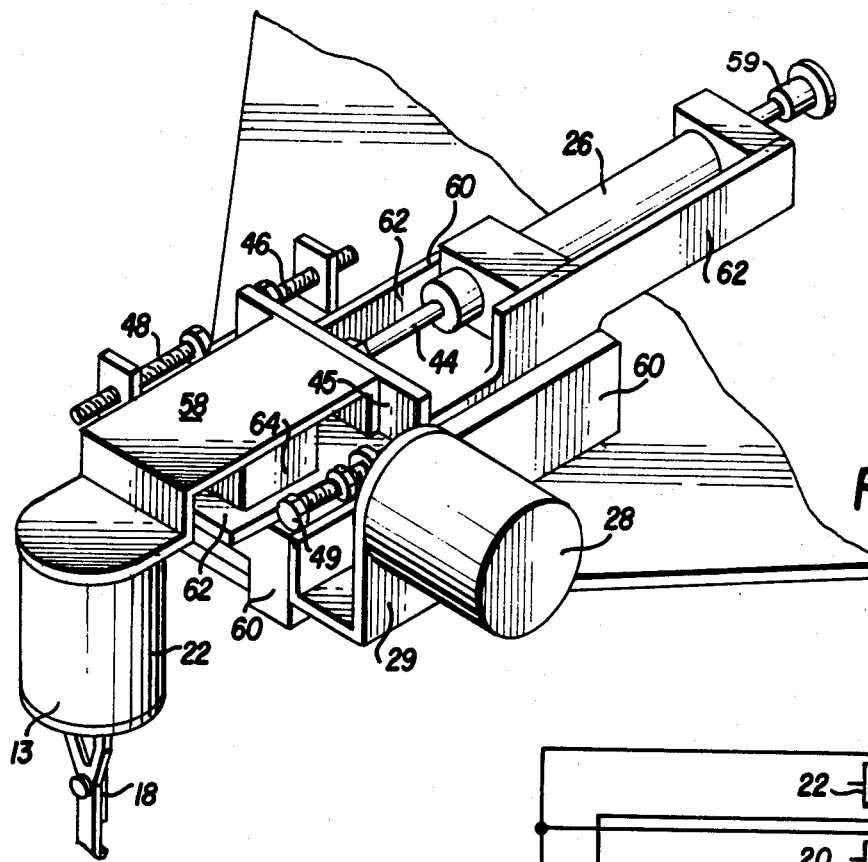
FIG. 6 is an enlarged perspective view of the front pincer unit and its associated mountings and pneumatic cylinders.

FIGS. 6 and 7 show front pincer unit 18 and its associated structures in greater detail. Front pincer unit 18 has a finger 19 rigidly mounted on a circular plate 13. Circular plate 13 is, in turn, rigidly mounted on air cylinder 22. A thumb 17 is slideably mounted on finger 19 and it has a circular connector 15 at its proximal end for connection with the piston rod of air cylinder 22. Finger 19 is provided with a flange 21. As with the rear pincer units, flange 21 and the distal end of thumb 17 are preferably beveled for promoting a secure pinching grip on the edge of a circuit board.

As shown in FIG. 6, front squeeze cylinder 26 drives limit bar 45 and driving bracket 58 by means of its piston rod 44. This imparts a prehensiling movement to front pincer unit 18 along the direction of the wrist axis of the hand so that front pincer unit 18 may be moved toward or away from rear pincer units 16. Limit bar 45 protrudes transversely on either side of driving bracket 58. On one side, a rear limit adjustment bolt 46 and a forward limit adjustment bolt 48 are mounted so as to interfere with the movement of limit bar 45, thereby limiting the prehensiling movement of front pincer unit 18 accordingly. A structure is also provided to impose a short forward movement limit on limit bar 45 and thus, front pincer unit 18. For this purpose, short limit cylinder 28 is mounted by means of a bracket 29 on the side of sliding block 60. An adjustment bolt 49 is mounted transversely on the piston rod 51 (see FIG. 1) of short limit cylinder 28. By operation of the piston within cylinder 28, short limit adjustment bolt 49 may be positioned either to block the forward movement of limit bar 45 or not.

Figure 8A:
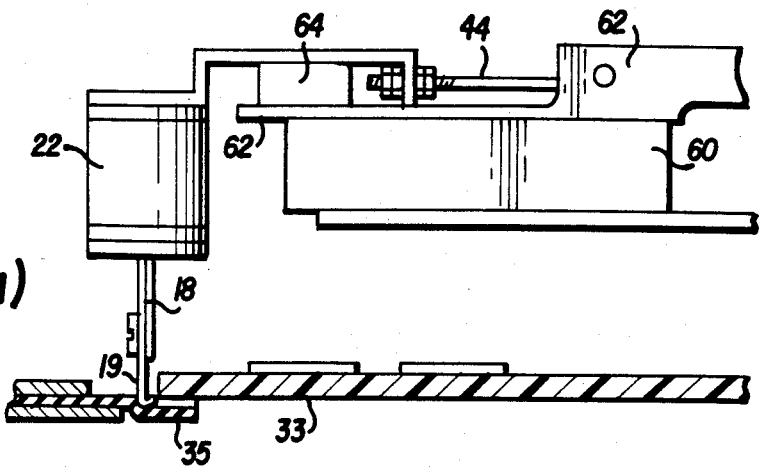
FIGS. 8(a), 8(b) and 8(c) show a sequence of operations of the front pincer unit and some of its associated structures.

From the foregoing description, it will be understood that driving bracket 58 and limit bar 45 are slideably mounted with respect to mounting bracket 62. Driving bracket 58 is supported by a spacer block 64 which slides along bracket 62, as shown in FIGS. 6 and 8(a), (b) and (c). As noted earlier, the range of prehensiling movements of front pincer unit 18, as limited by bolts 46 and 48, can be translated by the repositioning of sliding block 60 on track 57 shown in FIGS. 1 and 6.

Figure 9:
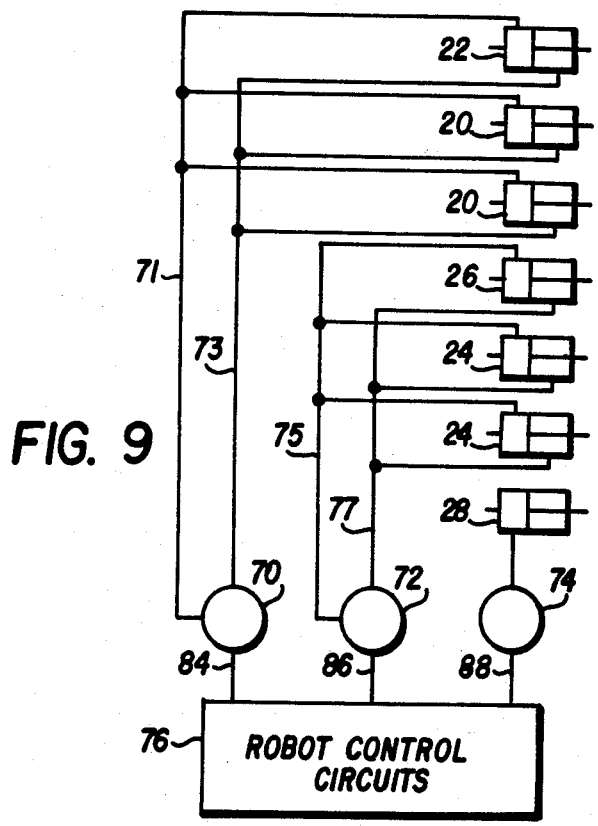
FIG. 9 is a schematic diagram showing how the air cylinders of the hand may be connected to robot control circuits.

FIG. 9 shows the manner in which the air cylinders described above are related to and controlled by the robot control circuits 76. Pinch solenoid 70 controls the operation of front pinch cylinder 22 and rear pinch cylinders 20 through pneumatic lines 71 and 73. Pinch solenoid 70 has two modes of operation, one in which air pressure from a compressed air source (not shown) is admitted to line 71 only and one in which air pressure is admitted to line 73 only. When solenoid 70 activates lines 71, the pistons in cylinders 20 and 22 are driven in one direction so as to resiliently urge their associated thumbs toward their corresponding flanges, thereby closing the pinching gaps. While hand 10 is holding a circuit board 32, a suitable amount of pressure may be maintained in pneumatic lines 71 in order to provide a continuous pinching action on the edges of the board. When solenoid 70 activates pneumatic line 73, the pistons within cylinders 20 and 22 operate to retract the thumbs connected to them. In a similar way, solenoid 72 controls the operation of squeeze cylinders 24 and 26 through pneumatic lines 75 and 77. When solenoid 72 activates line 75, front squeeze cylinder 26 and rear squeeze cylinders 24 operate in one direction to resiliently drive their associated pincer units in prehensiling movements away from one another. The movement of front pincer unit 18 will either be limited to its short forward limit or its long forward limit depending upon the condition of solenoid 74 and air cylinder 28. When pneumatic line 77 is activated, cylinders 26 and 24 will serve to resiliently drive their associated pincer units toward one another, thereby squeezing a circuit board located between them. Again, while hand 10 is holding a circuit board, a suitable amount of air pressure may be maintained in line 77 in order to provide a continuous squeezing action against the edges of the board. The solenoids 70, 72 and 74 are controlled by robot control circuits 76 through electrical lines 84, 86 and 88.

Figure 8B:
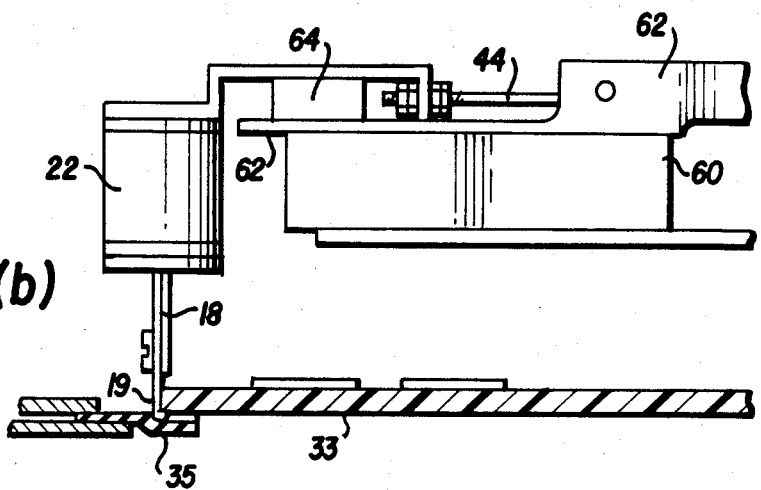
Figure 8C:
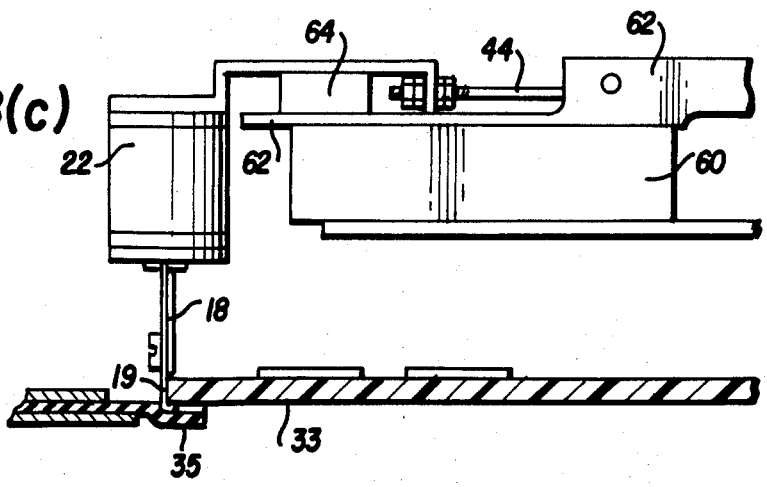

The operation of the robot hand of this invention is illustrated in FIGS. 5(a), 5(b) and 5(c), showing the movements of the rear pincer units and in FIGS. 8(a), 8(b) and 8(c), showing the movements of the front pincer unit 18. In those figures, the pincer units are shown picking up a circuit board 33 resting on a gasket 35. The movements shown are controlled by the robot control circuits. In FIGS. 5(a) and 8(a), the pincer units have been spread apart by the operation of their associated squeeze cylinders as described above. It will be understood, however, that short limit air cylinder 28 will have been operated to impose the short forward limit on the travel of the front pincer unit 18 since this is necessary to avoid damaging gasket 35 as explained earlier. Otherwise, the pincer units would be spread so far apart that upon driving them together, they might entrap a portion of the gasket between themselves and the board. With the front and rear pincer units thus spread apart from one another, the opposing edges of circuit board 33 may be bracketed between the front and rear pincer units, as illustrated in FIGS. 5(a) and 8(a). Under robot control, the hand 10 and, thus, fingers 39 and 19 will be driven slightly against the gasket 35 thereby depressing it and moving the pinching gaps to positions where they are opposite and facing their associated edge of circuit board 33. Once that has been accomplished, squeeze cylinders 24 and 26 are operated to resiliently drive the front and rear pincer units toward one another thereby squeezing circuit board 33 between them. This position is illustrated in FIGS. 5(b) and 8(b). Note that the pinching gaps have not been closed as yet. Finally, pinching cylinders 20 and 22 are operated to drive their thumbs toward the flanges of their associated fingers, thus pinching the edges of the circuit board. The robot may then be operated to pick up and transport the board to a desired station. The same procedure is followed in reverse when placing a circuit board on a test fixture. Hear again, the short limit air cylinder 28 will have been operated to impose the short forward limit on the travel of the front pincer unit 18. This is to prevent the pincer units from being spread apart so far upon releasing a board as to cause undue outward pressure on it. Such undue pressure could cause the gasket to tear or to become dislodged from its fixturing system.

It will be understood that the operation of the robot hand of this invention is similar when it is used to pick up a circuit board from a tote box. One important difference is that the short forward limit on the travel of front pincer unit 18 is not imposed. That is because the location of a circuit board within a tote box is generally not as precise as it is on a test fixture. Accordingly, the front and rear pincer units must be more spread apart from one another for bracketing the circuit board to be picked up.

It is now apparent that the robotic hand of this invention offers a number of significant advantages. The use of relatively narrow fingers, coupled with the limitations on their prehensiling movements, enable the hand to depress a test fixture gasket and remove a circuit board therefrom without damaging the gasket. When the short limit on the outward movement of the fingers is not imposed, the hand is able to pick up a board less accurately placed within a tote box. It may also be observed that the rear pincer units form a lateral reference line when they are driven to their squeezing positions. In those positions, the rear pincer units are substantially perpendicular to the palm 12 and the resulting reference line between them is useful in programming the movements of the robot system. This arrangement also permits the front pincer unit 18 to adopt various positions along the wrist axis in order to accommodate variations in the widths of circuit boards.

Another advantage of the invention described above concerns its continuous application of pinching and squeezing forces on the circuit board. The pneumatics employed permit the continuous application of these forces so that the grip of the hand can adapt itself to flexure of a board as it is being transported.

Those skilled in the art will recognize that the above described movements of the robot hand and its pincer unit will be under the program control of the robot system with which the hand is used. Although the sequence of movements described is believed to be the preferred sequence, other sequences might be more appropriate for certain situations. Changing from one sequence to another can, of course, be accomplished by modification of the software used in the robot system. It will also be appreciated that the lateral adjustments of the rear sliding blocks 52 and the front sliding blocks 60 can also be program controlled. This would require the use of additional driving mechanisms for causing the intended movements and the use of additional control circuitry as well. Also, various modifications may be made in the hardware of this invention. For example, the air cylinders could be replaced by some other form of driving mechanism such as servomotors. Different structures could be used to provide the prehensiling movements of the pincer units or to modify the range of prehensiling movements of the pincer units or to provide for the lateral adjustment of the rear pincer units. These and other modifications may be made without departing from the spirit of this invention. It is intended to encompass all such modifications within the scope of the following appended claims.

What is claimed:

1. A robot hand for use in individually picking up, transporting and releasing a variety of loaded circuit boards without impinging upon the circuitry, components and connectors on the boards, each board having first and second opposing edges, comprising:

a palm having a wrist connection site for connection with a wrist of a robot;

a first pincer unit depending from the palm for engaging a first edge of a circuit board;

second and third pincer units, depending from the palm for engaging a second opposing edge of the board, said second and third pincer units lying along a predetermined reference line with which said second edge of the board is aligned by said pincer units;

means for adjusting the relative positions of said second and third pincer along said reference line so that said second and third pincer units selectively engage clear spots along said second edge of the board;

each pincer unit being adapted to pinch and hold its corresponding edge of the circuit board by means of a thumb and finger set, each set defining a pinching gap and each set being operable between a pinching state in which the gap is relatively closed and an open state in which the gap is relatively open, and the configuration of the pincer units and their pinching gaps being such as to hold a board between the units in a spaced-apart relationship with respect to the palm.

2. The robot hand of claim 1 further comprising means for producing prehensiling movement of pincer units on opposing edges of the board toward one another so as to squeeze the board between them and away from one another so as to permit bracketing of the board between them or so as to release the board from between them.

3. The robot hand of claim 1 or 2 wherein the first pincer unit is translatably mounted on the palm for movement toward and away from the reference line and further comprising means for controllably translating said first pincer unit relative to said reference line to accommodate circuit boards of various sizes.

4. The robot hand of claim 3 wherein the palm lies substantially in a plane parallel to a wrist axis and is rotatable about said wrist axis and wherein said reference line is substantially perpendicular to said wrist axis.

5. The robot hand of claim 3 wherein said second and third pincer units are translatably mounted on the palm for independent movement toward and away from one another along the reference line.

6. The robot hand of claim 3 wherein the first pincer unit is distal to the wrist connection site and the second and third pincer units are located proximate to the wrist connection site and on opposite sides of said site.

7. The robot hand of claim 3 wherein the finger of each pincer unit has a flange on its end distal to the palm and wherein the thumb is slidably mounted on the finger for reciprocating movement toward and away from the flange.

8. The robot hand of claim 7 wherein the thumb has a tapered end for engagement with the circuit board so as to draw the pincer unit toward the board as it pinches the board.

9. The robot hand of claim 2 wherein said first pincer unit is translatably mounted on the palm for movement toward and away from the pincer units adjacent the opposing edge of the board within a range between a distal limit position and a proximate limit position, respectively, and wherein the prehensiling movement producing means includes means for selectively resiliently driving said first pincer unit toward those positions.

10. The robot hand of claim 9 further comprising means for selectively imposing a second proximate limit position on the movement of said first pincer unit for use in picking up a board from a test fixture, said second limit being intermediate the distal limit and the first proximate limit.

11. The robot hand of claim 10 further comprising means for controllably translating the range of prehensiling movement of said first pincer unit toward and away from the pincer units adjacent the opposing edge of the board in order to accommodate circuit boards of various sizes.

12. The robot hand of claim 2 wherein at least one of the pincer units is hingedly mounted to said palm for pivoting movement toward and away from a pincer unit adjacent the opposing edge of the board thereby affording a squeezing position and a releasing position, respectively, and wherein the prehensiling movement producing means includes means for selectively pivoting said hingedly mounted pincer unit toward those positions.

13. The robot hand of claim 3 further comprising drive means for controllably actuating said pincer units to bracket opposing edges of a board to be grasped, to squeeze the board between the pincer units and to pinch clear spots on the edges of the board.

14. The robot hand of claim 3 wherein the pinching gap of at least one pincer unit in its open state is sized so that the hand can grasp circuit boards in a tote box where the location of the circuit boards may vary on the order of plus or minus 30 mils.

15. The robot hand of claim 2 wherein the pincer units extend generally perpendicularly to said palm, are designed to hold a board in a predetermined reference plane and pinch substantially just the edge of the board.

16. A method for individually grasping a variety of loaded circuit boards with a robot hand, each board having first and second opposing edges, comprising the steps of:

including within the robot hand first, second and third pincer units depending therefrom of the type having a closable pinching gap, said first pincer unit being designed to engage a first edge of a circuit board, said second and third pincer units being designed to engage a second opposing edge of the circuit board and being translatable along a predetermined reference line;

positioning the robot hand with respect to the board to be grasped so that the pinching gaps of the pincer units bracket the opposing edges of the board;

positioning the second and third pincer units along said reference line so that they will engage clear spots along the second edge of the board;

producing prehensiling movement of at least one of the pincer units to squeeze the board between the pincer units with the bracketed edges of the board located within the pinching gaps and so that the second edge of the board is aligned with said reference line; and pinching the board at its edges by closing the pinching gaps.

17. The method of claim 16 wherein said variety of boards includes boards of various sizes and further including the step of:

translating at least one of said pincer units relative to the other pincer units to accommodate the size of the particular board to be grasped.

18. The method of claim 16 wherein the board to be grasped rests on a deformable gasket and wherein the bracketing step includes the step of:

depressing the gasket by pressing a pincer unit against it.

19. The method of claim 16 wherein the precise location of the board to be grasped is not known and further including the step of:

providing at least one of the pincer units with a pinching gap sized so that the robot hand can grasp the circuit board regardless of where it is located within a specified tolerance.

* * * * *